US008935842B2

(12) United States Patent
Fengler et al.

(10) Patent No.: US 8,935,842 B2
(45) Date of Patent: Jan. 20, 2015

(54) SLEEVE REMOVAL DEVICE

(75) Inventors: Richard R. Fengler, Mesa, AZ (US); Mark A. Schmier, II, Mesa, AZ (US)

(73) Assignee: The Boeing Company, Chicago, IL (US)

( * ) Notice: Subject to any disclaimer, the term of this patent is extended or adjusted under 35 U.S.C. 154(b) by 380 days.

(21) Appl. No.: 13/227,593

(22) Filed: Sep. 8, 2011

(65) Prior Publication Data

US 2013/0061443 A1 Mar. 14, 2013

(51) Int. Cl.

| | |
|---|---|
| ***B23P 19/00*** | (2006.01) |
| ***B23Q 15/00*** | (2006.01) |
| ***H01R 43/00*** | (2006.01) |
| ***H05K 13/00*** | (2006.01) |
| ***H01B 13/012*** | (2006.01) |

(52) U.S. Cl.

CPC ................................ *H01B 13/01209* (2013.01)

USPC .......... 29/426.1; 29/426.3; 29/426.5; 29/700; 29/707; 29/711; 29/855

(58) Field of Classification Search

CPC ................... H01B 13/01209; H01B 13/01263; H01B 13/0129; B23P 19/02; B23P 19/04; B23P 21/008; B23P 19/00; B23P 19/025; B08B 9/083

USPC .......... 29/426.1, 700, 426.3, 426.5, 707, 711, 29/855

See application file for complete search history.

(56) References Cited

U.S. PATENT DOCUMENTS

| | | | | |
|---|---|---|---|---|
| 1,969,696 | A * | 8/1934 | Hewton | 33/742 |
| 3,180,442 | A * | 4/1965 | Pomeroy | 180/194 |
| 3,312,053 | A * | 4/1967 | Takamune et al. | 368/132 |
| 3,406,851 | A * | 10/1968 | Sundberg | 414/487 |
| 3,522,971 | A * | 8/1970 | Buschbom | 301/43 |
| 3,894,731 | A * | 7/1975 | Evans | 269/47 |
| 3,985,852 | A * | 10/1976 | Evans | 264/132 |
| 4,083,268 | A * | 4/1978 | Kober | 81/9.4 |
| 4,365,400 | A * | 12/1982 | Carlomagno | 29/235 |
| 4,451,965 | A * | 6/1984 | Carlomagno | 29/450 |
| 4,655,129 | A * | 4/1987 | Wirth et al. | 101/35 |
| 4,736,501 | A | 4/1988 | Fujimoto | |
| 4,865,895 | A * | 9/1989 | Vlamings et al. | 428/98 |
| 4,868,023 | A * | 9/1989 | Ryan et al. | 428/35.1 |
| 5,021,111 | A * | 6/1991 | Swenson | 156/264 |
| 5,110,638 | A * | 5/1992 | Vogdes et al. | 428/35.1 |
| 5,865,085 | A * | 2/1999 | Vollenweider | 83/861 |
| 6,089,125 | A * | 7/2000 | Cheng | 81/9.44 |
| 6,334,253 | B1 * | 1/2002 | Cheng | 30/90.7 |
| 6,875,304 | B2 * | 4/2005 | Schanke et al. | 156/277 |
| 7,469,736 | B2 * | 12/2008 | Fries et al. | 156/541 |
| 7,735,404 | B2 * | 6/2010 | Wilk | 83/869 |
| 2003/0219177 | A1 * | 11/2003 | Salvaro | 383/101 |

* cited by examiner

*Primary Examiner* — Jermie Cozart
*Assistant Examiner* — Bayan Salone
(74) *Attorney, Agent, or Firm* — Armstrong Teasdale LLP

(57) ABSTRACT

Methods and systems for use in releasing tubing sleeves coupled to one or more bandoliers are disclosed. In one example, an apparatus for use in releasing tubing sleeves coupled to a bandolier includes a feed system and a dislodge system. The feed system is configured to engage a bandolier and selectively position the bandolier in the apparatus. The dislodge system is configured to dislodge tubing sleeves from an initial position on a bandolier propelled by the feed system.

20 Claims, 6 Drawing Sheets

SLEEVE REMOVAL DEVICE

BACKGROUND

The field of the disclosure relates generally to tubing sleeves, and more specifically to methods and systems for dislodging heat shrink tubing sleeves.

Heat shrink tubing is utilized for many purposes, including wire and cable identification and/or insulation. In some known systems, short lengths, also referred to as sleeves, of heat shrink tubing are attached to a bandolier. The heat shrink tubing is commonly coupled to the bandolier by partially shrinking the tubing around a protruding rib of the bandolier. The bandolier of tubing may be fed into a printer to print information, such as wire identification information, on the tubing. An installer removes the tubing sleeves from the bandolier and positions the tubing on the appropriate wires. Heat is then applied to the tubing to shrink it in place on the wires.

Typically, removing heat shrink tubing from a bandolier is a manual process. In some known methods, a clamping tool is used to grasp a sleeve of heat shrink tubing coupled to a bandolier and the manual removal tool is used to remove the heat shrink tubing. Often, the removal tool resembles a pair of tweezers and that must be squeezed with the installer's fingers to close the tool on or behind the tubing sleeve. After grasping a sleeve with the removal tool, the installer pulls the sleeve, via the tool, off of the rib of the bandolier to which the sleeve is coupled. The removal process requires hand strength, dexterity, and patience. In some known applications, such as labeling a complex wiring harness, this process may be repeated tens or hundreds of times.

BRIEF DESCRIPTION

According to one aspect of the present disclosure, an apparatus for use in releasing tubing sleeves coupled to a bandolier includes a feed system and a dislodge system. The feed system is configured to engage a bandolier and selectively position the bandolier in the apparatus. The dislodge system is configured to dislodge tubing sleeves from an initial position on a bandolier propelled by the feed system.

In another aspect, a method for releasing tubing sleeves coupled to a bandolier includes engaging a bandolier with a feed wheel, propelling the bandolier into a dislodge system using the feed wheel, and dislodging tubing sleeves from an initial position on the bandolier with the dislodge system.

In yet another aspect, a system for use in removing heat shrink tubing from a bandolier is disclosed. The bandolier has a spine and a plurality of ribs extending from the spine. The heat shrink tubing is coupled to the ribs of the bandolier by partial shrinking of the heat shrink tubing. The system includes a feed assembly and a dislodge assembly. The feed assembly is configured to engage a bandolier and selectively position the bandolier in the system. The dislodge assembly is configured to dislodge heat shrink tubing from an initial installed position on a bandolier propelled by said feed system. The dislodge assembly is configured to dislodge heat shrink tubing by breaking a friction bond formed by partially heat shrinking the heat shrink tubing to the ribs.

The features, functions, and advantages that have been discussed can be achieved independently in various embodiments or may be combined in yet other embodiments further details of which can be seen with reference to the following description and drawings.

DETAILED DESCRIPTION

As used herein, an element or step recited in the singular and proceeded with the word "a" or "an" should be understood as not excluding plural elements or steps unless such exclusion is explicitly recited. Furthermore, references to "one embodiment" of the present invention or the "exemplary embodiment" are not intended to be interpreted as excluding the existence of additional embodiments that also incorporate the recited features.

Exemplary methods and systems for removing heat shrink tubing sleeves from a bandolier are described herein. The methods and systems described herein facilitate quicker removal of sleeves from a bandolier as compared to some known methods and systems used to remove heat shrink tubing sleeves from a bandolier. Further, the methods and systems described herein may be more ergonomic to users than some known, manual removal methods and systems. As such, methods and systems implemented according to the present disclosure may improve productivity, reduce costs of construction, and/or decrease repetitive motion related injuries.

Figure 1:
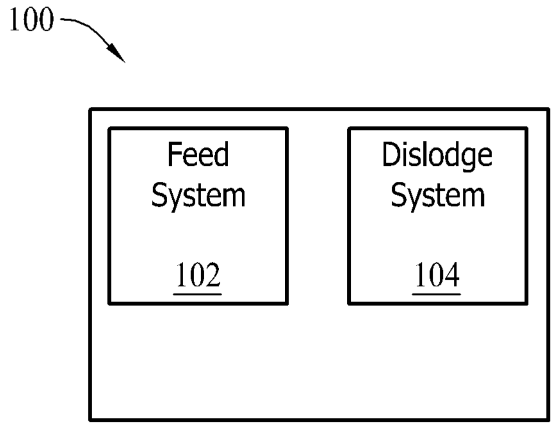
FIG. 1 is a block diagram of an exemplary apparatus for use in releasing tubing sleeves coupled to ribs of a bandolier.

Referring to the drawings, FIG. 1 is a block diagram of an exemplary apparatus, generally indicated by reference number 100, for use in releasing tubing sleeves coupled to a bandolier (not shown in FIG. 1). In the exemplary embodiment, apparatus 100 includes a feed system 102 and a dislodge system 104. Feed system 102 is configured to engage a bandolier and propel the bandolier into apparatus 100. Dislodge system 104 is configured to dislodge tubing sleeves from their initial position on a bandolier propelled by the feed system.

Figure 2:
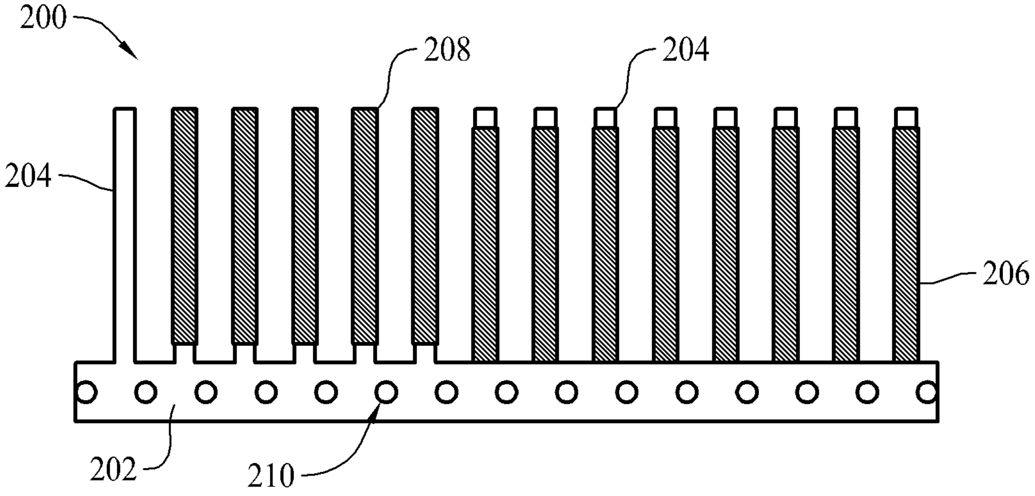
FIG. 2 is an exemplary bandolier including a spine, a plurality of ribs, and having heat shrink tubing sleeves attached thereto.
Figure 7:
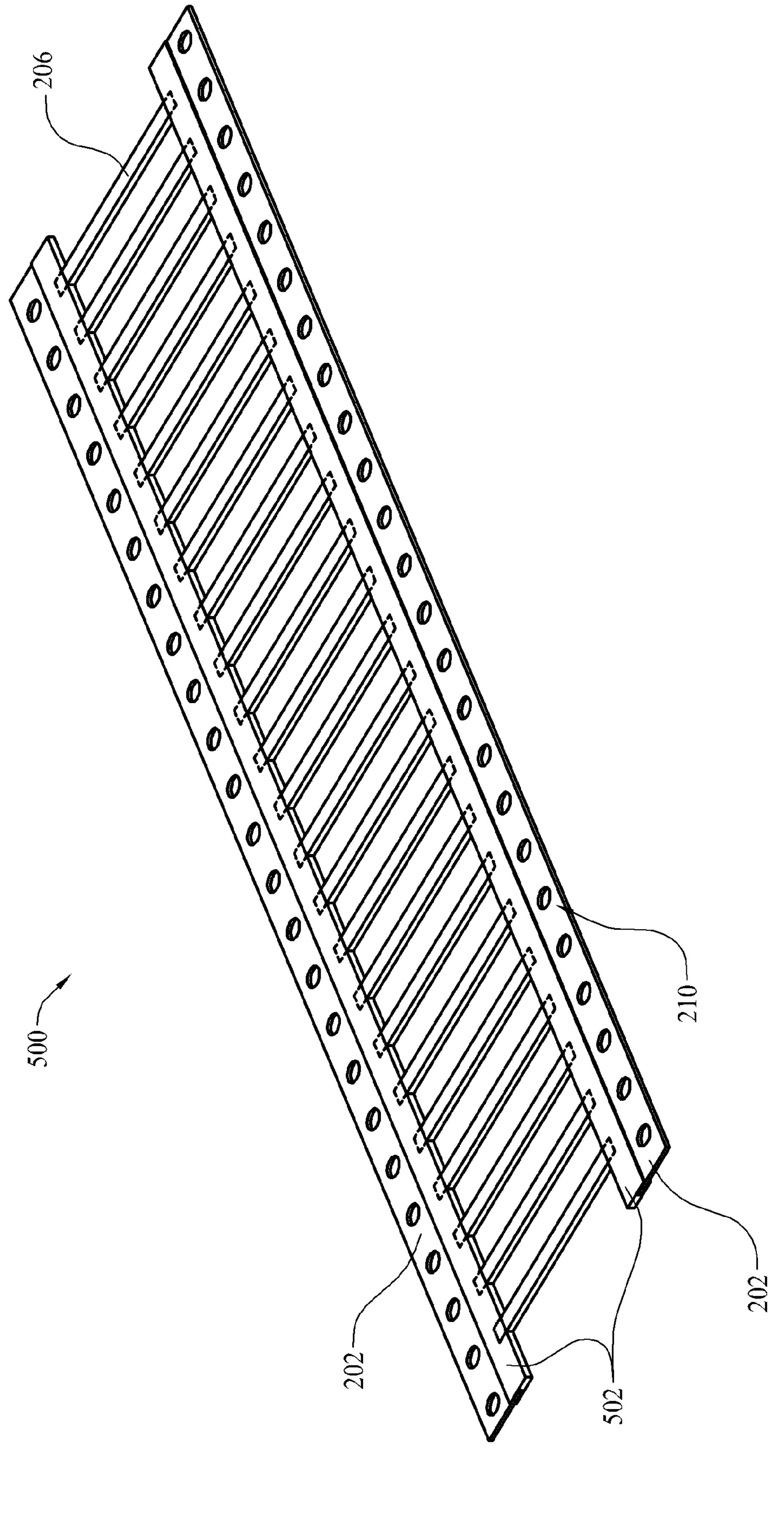
FIG. 7 is another exemplary bandolier including two spines having heat shrink tubing sleeves attached thereto.

FIG. 2 shows an exemplary bandolier 200. In the exemplary embodiment, bandolier 200 includes a spine 202 and a plurality of fingers or ribs 204 extending from spine 202. Heat shrink tubing sleeves 206, referred to herein as sleeves 206, are coupled to bandolier 200 and circumscribe ribs 204. Sleeves 206 are coupled to ribs 204 in a first, or initial, position as shown in FIG. 2. For explanatory purposes, a plurality of sleeves 208 are also illustrated in FIG. 2 in a second, or dislodged position with respect to ribs 204. In the exemplary embodiment, the initial position of sleeves 206 is adjacent to spine 202, and the dislodged position of sleeves 208 is spaced a distance from spine 202. In other embodiments, the initial position may be spaced apart from spine 202 and the dislodged position may be closer or farther from spine 202 than the initial position. Spine 202 includes a plurality of apertures 210 defined therein. In the exemplary embodiment, apertures 210 are spaced equidistantly across spine 202 for engagement by a traction wheel (not shown in FIG. 2), as will be explained in more detail below. Alternatively, apertures 21 may be differently located and/or spaced. In some embodiments, bandolier 200 may also include a second spine connected to ribs 204 opposite spine 202 and/or may include two spines coupled together by sleeves 206 with or without any ribs 204. For example, FIG. 7 shows an exemplary bandolier 500 with a plurality of sleeves 206 coupled to two spines 202 with connectors 502, which may be, for example, an adhesive, tape, etc.

Sleeves 206 are coupled in the initial position on ribs 204 when bandolier 200 is prepared, manufactured, assembled, etc. More specifically, sleeves 206 are coupled to ribs 204 by partially heat shrinking sleeves 206 to ribs 204 such that a relatively strong friction bond between sleeves 206 and ribs 204 is formed. Although FIG. 2 illustrates several sleeves 208 in the dislodged position, when initially assembled, bandolier 200 will typically include sleeves 206 coupled to ribs 204 only in the initial position. After sleeves 206 are securely coupled to ribs 204, the assembled bandolier 200 is ready for use. In the exemplary embodiment, a printer (not shown) prints relevant information on sleeves 206 coupled to bandolier 200. In other embodiments, bandolier 200 may be used without including printed information of sleeves 206, such as for insulation purposes.

To use sleeves 206, such as to identify wires (not shown) of a wiring harness (not shown), sleeves 206 are removed from bandolier 200, in general, and ribs 204, more particularly. To remove sleeves 206, the friction bond between sleeves 206 and ribs 204 must be disturbed, broken, released, etc. In the exemplary embodiment, this release is easily accomplished via exemplary apparatus 100.

Figure 3:
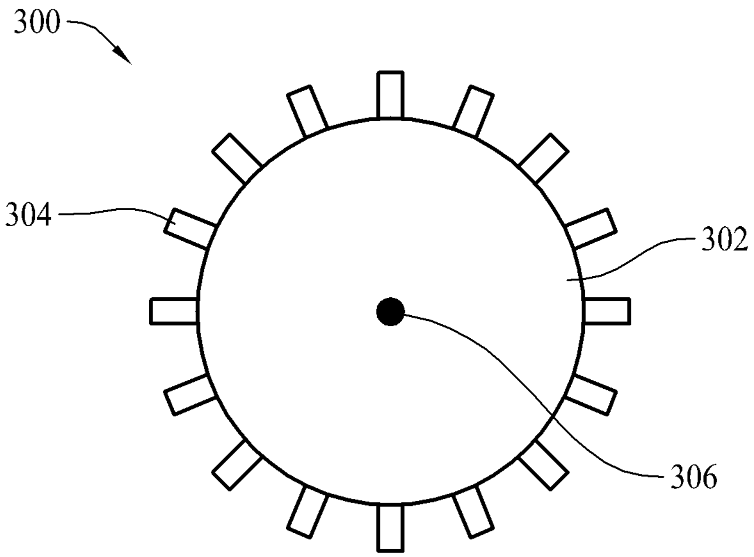
FIG. 3 is an exemplary traction wheel for use with the system shown in FIG. 1.

In operation, feed system 102 engages bandolier 200 and forces bandolier 200 into apparatus 100. Feed system 102 may engage bandolier 200 by any suitable method of engaging bandolier 200 such as, for example, a traction wheel, a conveyer belt, a moving clamp system, and/or a chute system. In the exemplary embodiment, feed system 102 includes a traction wheel (not shown in FIG. 1) that engages bandolier 200. An exemplary traction wheel 300 is shown in FIG. 3. Traction wheel 300 includes a central wheel 302 that includes a plurality of pins 304 extending radially outward therefrom. Pins 304 are configured, e.g. sized and spaced, to engage apertures 210 in spine 202 of bandolier 200. Traction wheel 300 is rotatable about its center 306. Thus, as traction wheel 300 is rotated, pins 304 engage bandolier apertures 210 and pull bandolier 200 in the direction of rotation of traction wheel 300. When rotated in a first or forward direction, traction wheel 300 propels bandolier 200 to dislodge system 104. When rotated in a second or backward direction, traction wheel propels bandolier 200 away from dislodge system 104. In the exemplary embodiment, traction wheel 300 is rotated with an electric motor (not shown in FIG. 3). In other embodiments, traction wheel 300 may be driven by, for example, a non-electric motor, a hand crank, etc. In other embodiments, feed system 102 may include a traction wheel that does not include pins 304. For example, in some embodiments, a traction wheel may use vacuum pressure to engage bandolier 200, or may rely on frictional forces to engage bandolier 200. In some embodiments, feed system 102 may not include traction wheel 300, but rather may utilize a different method of engaging bandolier 200, such as a chute system, a belt system, a moving clamp, etc.

As bandolier 200 is propelled into dislodge system 104, dislodge system 104 dislodges sleeves 206 from their initial position to the dislodged position of sleeves 208. In the exemplary embodiment, dislodge system 104 includes a pinch roller system (not shown in FIG. 1) that contacts each sleeve 206 as it passes a driven pinch roller and exerts a separation force in the longitudinal direction of ribs 204. This force displaces each sleeve 206 from its initial position to the dislodged position of sleeves 208. By dislodging sleeves 206 to the position of sleeves 208, the bond between sleeves 206 and ribs 204, formed by the partial heat shrinking of sleeves 206, is released and sleeves 206 may be easily removed from ribs 204. In the exemplary embodiment, dislodge system 104 does not remove sleeves 206 completely off of ribs 204, but only moves sleeves 206 to the dislodged position of sleeves 208. In other embodiments, dislodge system may dislodge sleeves 206 a greater or lesser distance than is illustrated in FIG. 2 and/or may completely remove sleeves 206 from ribs 204. In other embodiments, dislodge system 104 may use any other system suitable for dislodging sleeves 206 from their initial position. For example, dislodge system 104 may utilize a continuous stream or blast of compressed air to dislodge sleeves 206, may utilize a wedge-shaped plow to dislodge sleeves 206, and/or may use automated tweezers and/or pliers to dislodge sleeves 206. When used with a bandolier having two spines, such as exemplary bandolier 500 shown in FIG. 7, bandolier 500 may be fed through apparatus 100 twice, with each pass engaging a different one of spines 202. Each pass will dislodge sleeves 206 with respect to the spine 202 that is then engaged by traction wheel 300.

Figure 4:
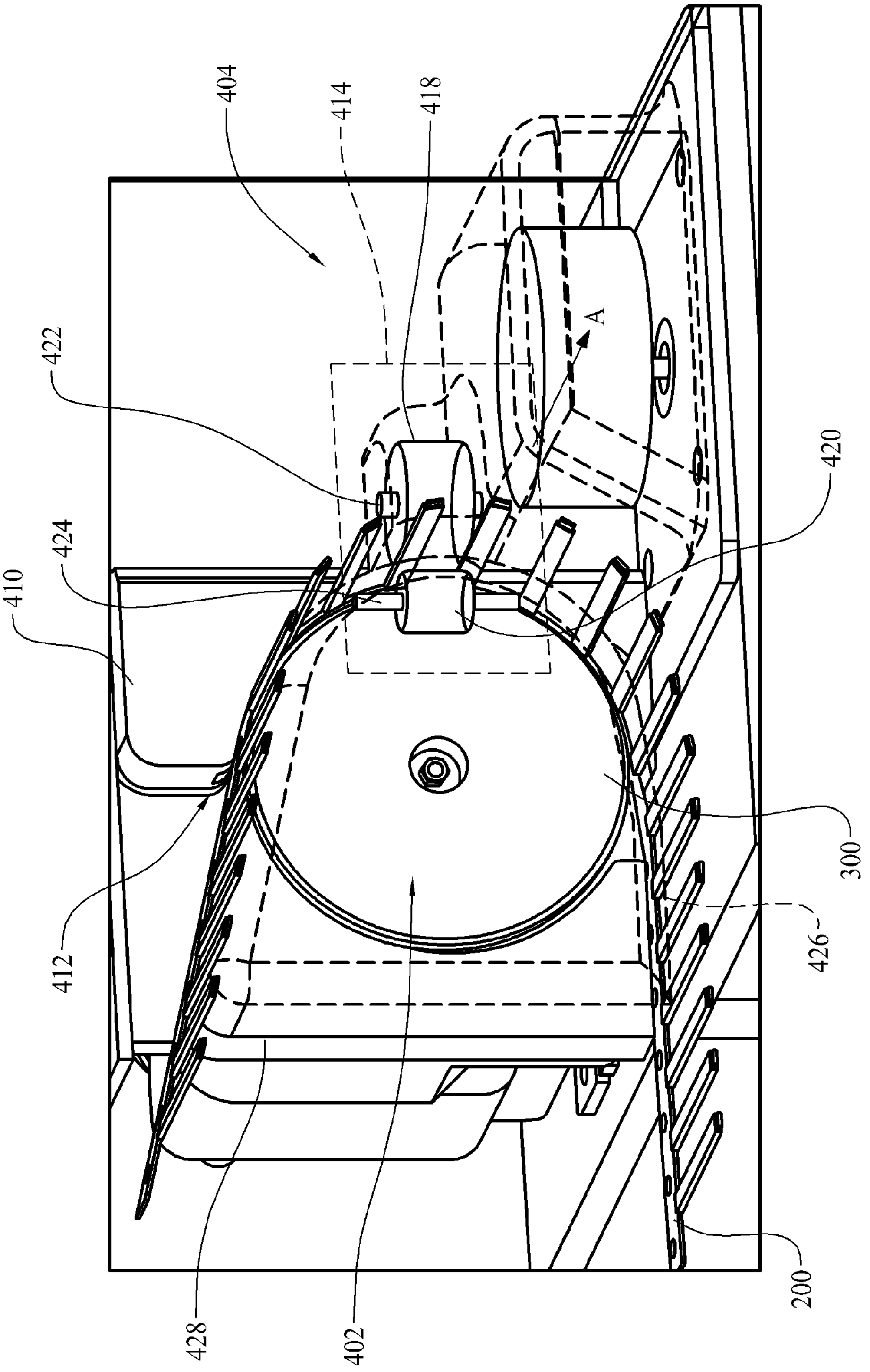
FIG. 4 is a partial perspective view of another exemplary apparatus for use in releasing tubing sleeves coupled to ribs of a bandolier.
Figure 5:
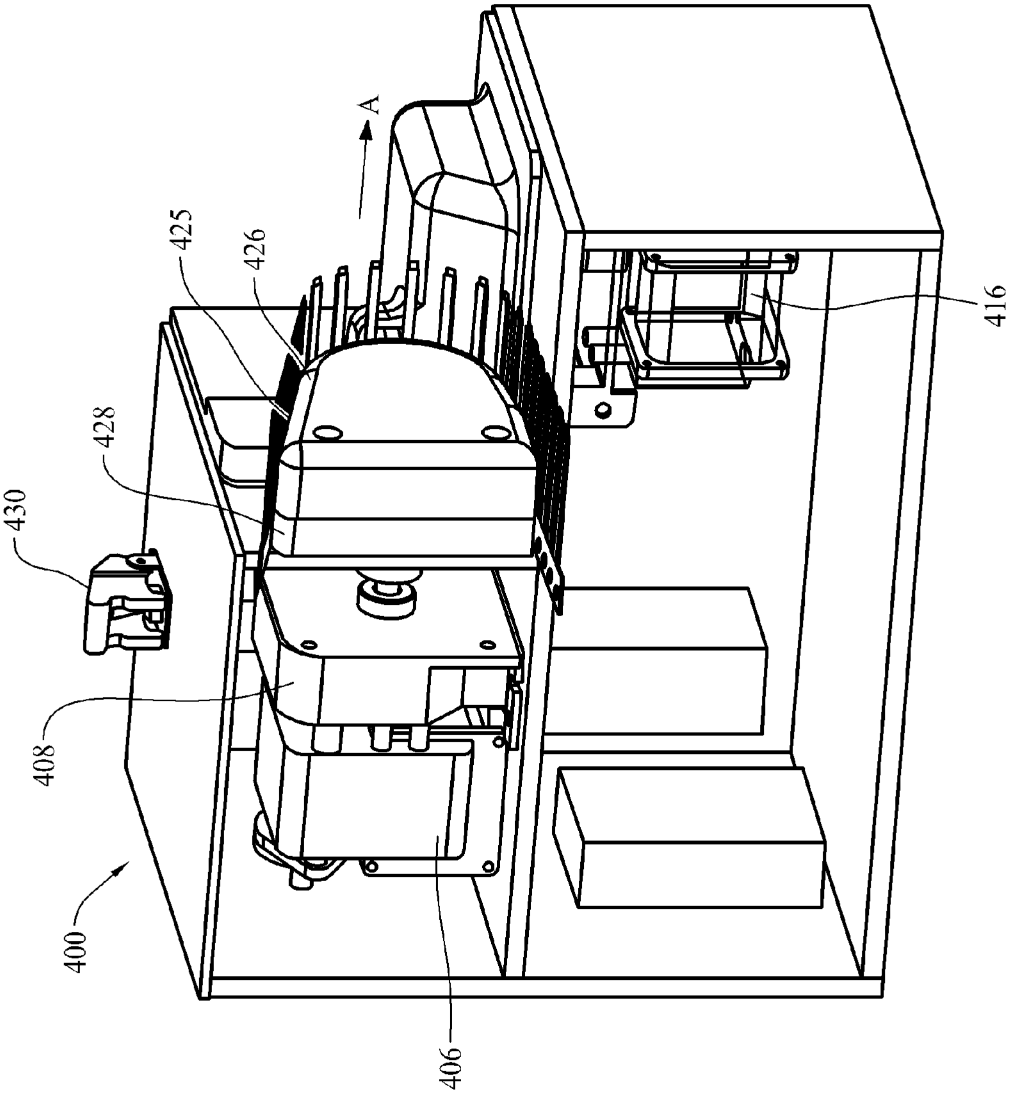
FIG. 5 is another perspective view of the apparatus shown in FIG. 4.
Figure 6:
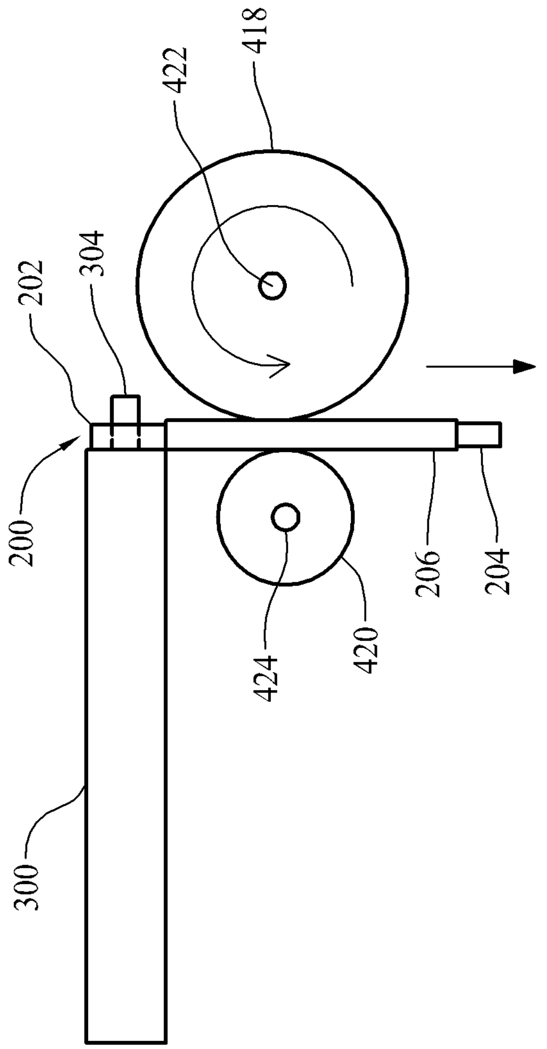
FIG. 6 is a top view of an exemplary pinch roller system for use in the exemplary apparatus shown in FIG. 4.

FIGS. 4 and 5 illustrate an exemplary apparatus 400 that may be used to release tubing sleeves, such as sleeves 206, coupled to ribs, such as ribs 204, of a bandolier, such as bandolier 200 or 500, using a pinch roller system 414. FIG. 6 is a simplified top view of a pinch roller system 414.

In the exemplary embodiment, apparatus 400 includes a feed system 402 and a dislodge system 404. Feed system 402 includes traction wheel 300 coupled to a motor 406 and a gearbox 408. In the exemplary embodiment, motor 406 drives rotation of traction wheel 300 via gearbox 408. In other embodiments, traction wheel 300 may be directly driven by motor 406. A housing 410 and traction wheel 300 cooperatively define a channel 412 through which bandolier 200 travels when propelled by traction wheel 300. The speed of rotation of traction wheel 300 controls the speed of processing bandoliers 200 through apparatus 400 (i.e., the speed of dislodging sleeves 206 from bandolier 200). In the exemplary embodiment, the speed of motor 406, and thus the speed of traction wheel 300, may be variably controlled by the user. In other embodiments, the speed of traction wheel 300 may be fixed, or may be variably controlled by a controller (not shown).

Dislodge system 404, in the exemplary embodiment, includes a pinch roller system 414 and a motor 416 coupled to pinch roller system 414. Pinch roller system 414 includes a first pinch roller 418 that rotates about axis 422, and a second pinch roller 420 that rotates around axis 424. In the exemplary embodiment, first pinch roller 418 is coupled to and driven by motor 416, while pinch roller 420 is a passive roller that freely rotates about axis 424. In other embodiments, second pinch roller 420 may be driven by motor 416 or another motor. In the exemplary embodiment, pinch roller 418 rotates at fixed speed, and the distance along ribs 204 that sleeves 206 are dislodged is established by the diameter of first pinch roller 418. In some embodiments, different diameter pinch rollers may be used to create different amounts of dislodging of sleeves 206. In other embodiments, the speed of rotation of pinch roller 418 may be varied, manually or automatically, to vary the amount by which sleeves 206 are dislodged.

In operation, a user (not shown) positions bandolier 200 on a ramp 425 defined by housing portions 426 and 428. Bandolier 200 is moved by the user towards channel 412 until traction wheel 300, and specifically pins 304, engage bandolier 200. Traction wheel 300 is rotated by motor 406 and traction wheel 300 propels bandolier 200 into apparatus 400. A reversing switch 430 enables the user to selectively reverse rotation of traction wheel 300 and to thus reverse the motion of bandolier 200 (e.g., to remove bandolier 200). As traction wheel 300 rotates, bandolier 200 is pulled through channel 412 towards pinch roller system 414.

As shown in FIG. 6, when bandolier 200 is propelled into pinch roller system 414, successive sleeves 206 are forced between pinch rollers 418 and 420. The driven rotation of pinch roller 418 exerts a force on each sleeve 206 in a direction A. Because bandolier spine 202 is retained in a substantially fixed position relative to traction wheel 300 by pins 304, the force exerted on sleeve 206 causes sleeve 206 to move away from traction wheel 300, and hence away from spine 202, along the direction A. Thus, pinch roller system 414 dislodges sleeves 206 from their initial position to the dislodged position of sleeves 208 (shown in FIG. 2) enabling removal of sleeves 206 from bandolier 200.

Thus, exemplary embodiments may enable quicker removal of sleeves from a bandolier as compared to some known methods of removing heat shrink tubing sleeves from a bandolier. Further, exemplary embodiments may be more ergonomic to users as compared to known, manual removal methods. Such embodiments may help to reduce the occurrence of repetitive motion injuries. Accordingly, exemplary embodiments described herein may improve worker productivity, reduce costs of construction, and/or decrease repetitive motion related injuries.

This written description uses examples to disclose various embodiments, which include the best mode, to enable any person skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An apparatus for use in releasing tubing sleeves coupled to a bandolier, said apparatus comprising:

a feed system configured to engage a bandolier and to selectively position the bandolier in said apparatus, said feed system comprising a housing and a traction wheel that define a channel therebetween through which said bandolier is propelled; and a dislodge system configured to dislodge tubing sleeves from a bandolier propelled through the channel by said feed system, wherein said dislodge system is configured to operate substantially continuously as the bandolier is fed through said dislodge system, said dislodge system further configured to dislodge the tubing sleeves from an initial installed position to a dislodged position such that the tubing sleeves remain engaged with the bandolier.

2. An apparatus in accordance with claim 1, wherein said dislodge system comprises at least a first pinch roller and a second pinch roller, said first pinch roller and said second pinch roller are configured to cooperatively dislodge tubing sleeves from their initial position on a bandolier.

3. An apparatus in accordance with claim 2, further comprising a motor coupled to selectively drive the first pinch roller.

4. An apparatus in accordance with claim 3, wherein said second pinch roller is not coupled to said motor.

5. An apparatus in accordance with claim 2, wherein said feed system selectively positions tubing sleeves between said first and second pinch rollers.

6. An apparatus in accordance with claim 1, wherein said traction wheel is configured to engage the bandolier to propel the bandolier into said apparatus.

7. An apparatus in accordance with claim 1, wherein said traction wheel comprises a plurality of projecting pins sized for insertion within a plurality of apertures defined in the bandolier.

8. An apparatus in accordance with claim 1, wherein said dislodge system is configured to dislodge heat shrink tubing sleeves.

9. A method for releasing tubing sleeves coupled to a bandolier, said method comprising:

engaging a bandolier with a feed wheel;

propelling the bandolier into a dislodge system using the feed wheel, wherein the bandolier is propelled through a channel defined between the feed wheel and a housing; and dislodging tubing sleeves from the bandolier with the dislodge system, wherein the dislodge system is configured to operate substantially continuously as the bandolier is fed through the dislodge system, the dislodge system further configured to dislodge the tubing sleeves from an initial installed position to a dislodged position such that the tubing sleeves remain engaged with the bandolier.

10. A method in accordance with claim 9, wherein engaging a bandolier with a feed wheel comprises engaging a spine of a bandolier with a traction wheel.

11. A method in accordance with claim 10, wherein engaging a bandolier with a feed wheel comprises engaging a spine of a bandolier with a traction wheel using a plurality of pins projecting radially outward from the traction wheel.

12. A method in accordance with claim 9, wherein dislodging tubing sleeves from an initial position comprises dislodging tubing sleeves from the initial position using at least a pair of pinch rollers.

13. A method in accordance with claim 12, wherein dislodging tubing sleeves from an initial position comprises:

receiving tubing sleeves between the pair of pinch rollers; and driving at least one pinch roller of the pair of pinch rollers to rotate.

14. A system for use in removing heat shrink tubing from a bandolier having a spine and a plurality of ribs extending from the spine, the heat shrink tubing coupled to the ribs of the bandolier by partial shrinking of the heat shrink tubing, said system comprising:

a feed assembly configured to engage a bandolier and selectively position the bandolier in said system, said feed assembly comprising a housing and a traction wheel that define a channel therebetween through which said bandolier is propelled; and a dislodge assembly configured to dislodge heat shrink tubing from the bandolier propelled through the channel by said feed system, wherein said dislodge assembly is configured to operate substantially continuously as the bandolier is fed through said dislodge assembly, said dislodge assembly further configured to dislodge the heat shrink tubing from an initial installed position to a dislodged position such that the heat shrink tubing remains engaged with the bandolier, said dislodge assembly configured to dislodge heat shrink tubing by breaking a friction bond formed by partially heat shrinking the heat shrink tubing to the ribs.

15. A system in accordance with claim 14, wherein said dislodge assembly comprises a first pinch wheel and a second pinch wheel.

16. A system in accordance with claim 15, wherein said feed assembly is configured to selectively position the heat shrink tubing between the first and second pinch wheels, and at least one of the first and second pinch wheels is configured to apply a force to the heat shrink tubing in a direction along a rib on which the heat shrink tubing is coupled.

17. A system in accordance with claim 14, wherein said traction wheel is configured to engage a bandolier to propel the bandolier into said system.

18. A system in accordance with claim 14, wherein the traction wheel comprises a plurality of radially projecting pins configured for mating engagement with a plurality of apertures through the spine of a bandolier.

19. An apparatus in accordance with claim 1 further comprising a reversing switch configured to selectively reverse a motion of said bandolier.

20. A system in accordance with claim 14 further comprising a reversing switch configured to selectively reverse a motion of said bandolier.

* * * * *